(12) United States Patent
Lius et al.

(10) Patent No.: US 10,191,345 B2
(45) Date of Patent: Jan. 29, 2019

(54) DISPLAY DEVICE

(71) Applicant: InnoLux Corporation, Miao-Li County (TW)

(72) Inventors: Chandra Lius, Miao-Li County (TW); Kuan-Feng Lee, Miao-Li County (TW); Nai-Fang Hsu, Miao-Li County (TW)

(73) Assignee: INNOLUX CORPORATION, Miao-Li (TW)

( * ) Notice: Subject to any disclaimer, the term of this patent is extended or adjusted under 35 U.S.C. 154(b) by 0 days.

(21) Appl. No.: 15/484,161

(22) Filed: Apr. 11, 2017

(65) Prior Publication Data

US 2018/0120612 A1 May 3, 2018

Related U.S. Application Data

(60) Provisional application No. 62/415,542, filed on Nov. 1, 2016.

(51) Int. Cl.
| | |
|---|---|
| *G02F 1/1368* | (2006.01) |
| *G02F 1/1345* | (2006.01) |
| *G02F 1/1362* | (2006.01) |
| *H01L 27/12* | (2006.01) |
| *H01L 29/786* | (2006.01) |

(52) U.S. Cl.
CPC ........ *G02F 1/1368* (2013.01); *G02F 1/13454* (2013.01); *G02F 1/13624* (2013.01); *G02F 1/136209* (2013.01); *H01L 27/1225* (2013.01); *H01L 27/1237* (2013.01); *H01L 27/1251* (2013.01); *G02F 2001/13685* (2013.01); *G02F 2202/104* (2013.01); *H01L 29/7869* (2013.01); *H01L 29/78675* (2013.01)

(58) Field of Classification Search
CPC ............. H01L 27/1251; H01L 27/1237; H01L 27/1225; H01L 29/7869; H01L 29/78675; G02F 1/13624; G02F 1/13454; G02F 1/13685; G02F 1/13609; G02F 2001/13685; G02F 2202/104
See application file for complete search history.

(56) References Cited

U.S. PATENT DOCUMENTS

| | | | |
|---|---|---|---|
| 2016/0372497 A1* | 12/2016 | Lee | ...................... H01L 27/1255 |
| 2017/0186781 A1* | 6/2017 | Noh | ..................... H01L 27/1225 |

* cited by examiner

*Primary Examiner* — Thanhha Pham
(74) *Attorney, Agent, or Firm* — Bacon & Thomas, PLLC

(57) ABSTRACT

A display device is disclosed, which includes: a first substrate; a first transistor disposed on the first substrate, wherein the first transistor comprises a first semiconductor layer; a second transistor disposed on the first substrate, wherein the second transistor includes a second semiconductor layer; and a first insulating layer disposed under the first semiconductor layer; wherein a thickness of the first insulating layer is greater than or equal to 200 nm and less than or equal to 500 nm; and wherein one of the first semiconductor layer and the second semiconductor layer comprises a silicon semiconductor layer, and the other comprises an oxide semiconductor layer.

15 Claims, 9 Drawing Sheets

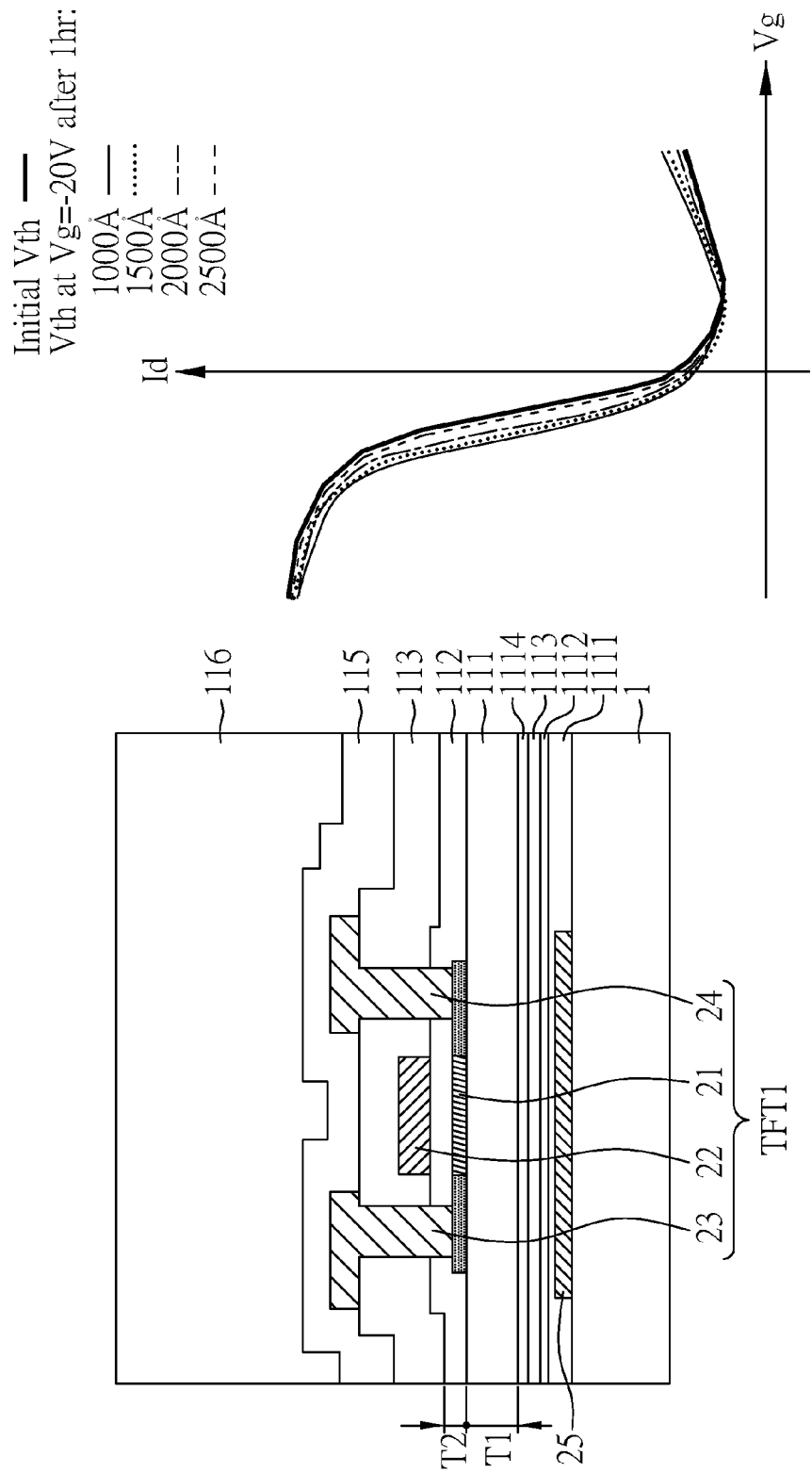

DISPLAY DEVICE

CROSS REFERENCE TO RELATED APPLICATION

This application claims the benefit of filing date of U.S. Provisional Application Ser. No. 62/415,542 filed Nov. 1, 2016 under 35 USC § 119(e)(1).

BACKGROUND

1. Field

The present disclosure relates to a display device, and more particularly to a display device comprising both a low-temperature polycrystalline silicon (UPS) thin film transistor and a metal oxide thin film transistor.

2. Description of Related Art

With the continuous advancement of technologies related to displays, all the display panels are now developed toward compactness, thinness, and lightness. This trend makes thin displays, such as liquid crystal display panels, organic light-emitting diode display panels and inorganic light-emitting diode display panels, replace cathode-ray-tube displays as the mainstream display devices on the market. Applications of thin displays are numerous. Most electronic products for daily use, such as mobile phones, notebook computers, video cameras, still cameras, music displays, mobile navigators, and TV sets, employ such display panels.

While liquid crystal display devices and organic light-emitting diode display devices are popular on the market, in which LCD display devices particularly enjoy technical maturity; manufacturers pay even more effort to improve display devices in terms of display quality thereby answering to ongoing technical development of display devices and consumers' increasing demands.

The thin film transistor (TFT) structure can be polycrystalline silicon thin film transistors (TFT) featuring high carrier mobility, or metal oxide thin film transistors (TFT) featuring low leakage. Though some of the features of polycrystalline silicon TFT and the features of metal oxide TFT are complementary to each other, there are presently no display combining these two types of transistors because the processes for making the two are not quite compatible, making the overall manufacturing of display devices complicated (such as by requiring more times of chemical vapor deposition process).

In view of this, a need exists for an improved and simplified process for manufacturing a thin film transistor (TFT) substrate that has both a polycrystalline silicon thin film transistor (TFT) and a metal oxide thin film transistor (TFT).

SUMMARY

The object of the present disclosure is to provide a display device, which has two types of transistors at the same time.

To achieve the object, the display device of the present disclosure comprises; a first substrate; a first transistor disposed on the first substrate, wherein the first transistor comprises a first semiconductor layer; a second transistor disposed on the first substrate, wherein the second transistor comprises a second semiconductor layer; and a first insulating layer disposed under the first semiconductor layer; wherein a thickness of the first insulating layer is greater than or equal to 200 nm and less than or equal to 500 nm; and wherein one of the first semiconductor layer and the second semiconductor layer comprises a silicon semiconductor layer, and the other comprises an oxide semiconductor layer.

In the display device of the present disclosure, the first insulating layer has a specific thickness ranging from 200 nm to 500 nm. When the thickness of the first insulating layer is lower than 200 nm, the negative-bias-temperature-stress (NBTS) stability of the transistor with the silicon semiconductor layer is reduced. Therefore, in the display device of the present disclosure, the specific thickness range of the first insulating layer is one factor relating to the performance of the transistor with the silicon semiconductor layer.

Other objects, advantages, and novel features of the disclosure will become more apparent from the following detailed description when taken in conjunction with the accompanying drawings.

BRIEF DESCRIPTION OF THE DRAWINGS

FIG. 8 is a schematic cross section view of a LTPS transistor used in Test example of the present disclosure.

FIG. 9 is a simulation result showing I-V curves of LTPS transistors with first insulating layers with different thicknesses.

DETAILED DESCRIPTION OF EMBODIMENT

The following embodiments when read with the accompanying drawings are made to clearly exhibit the above-mentioned and other technical contents, features and effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other substrate or film, but also intended indirectly contact with the other substrate or film.

Embodiment 1

Figure 1:
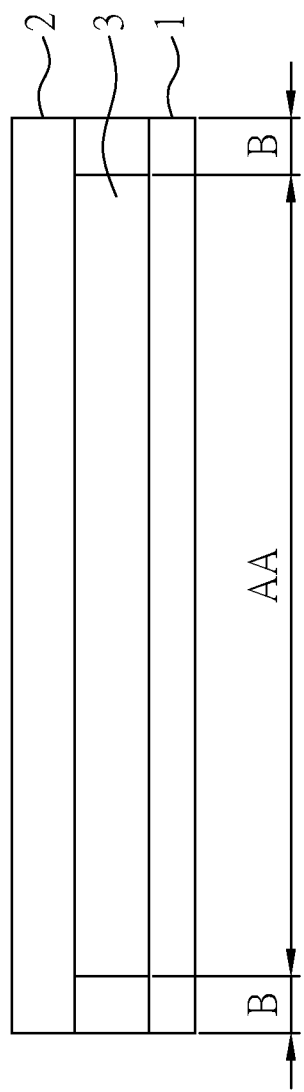
FIG. 1 is a schematic cross sectional view of a display device according to Embodiment 1 of the present disclosure.

FIG. 1 is a schematic cross sectional view of a display device of the present embodiment. Therein, the display device comprises: a first substrate 1; a second substrate 2 opposite to the first substrate 1; and a display medium layer 3 arranged between the first substrate 1 and the second substrate 2. In the present embodiment, the first substrate 1 and the second substrate 2 may be prepared by glass, plastic, a flexible material or a thin film; but the present disclosure is not limited thereto. When the first substrate 1 and the second substrate 2 is prepared by the plastic, the flexible material or the thin film, the display device can be a flexible display device.

In the present embodiment, the display medium 3 may comprise a liquid crystal layer, a light emitting diode (for example, an inorganic light emitting diode or an organic light emitting diode) or quantum dots; but the present disclosure is not limited thereto. In addition, in other embodiments of the present disclosure, when the display medium 3 is the light emitting diode, the display device can be optionally made without the second substrate 2.

Figure 2:
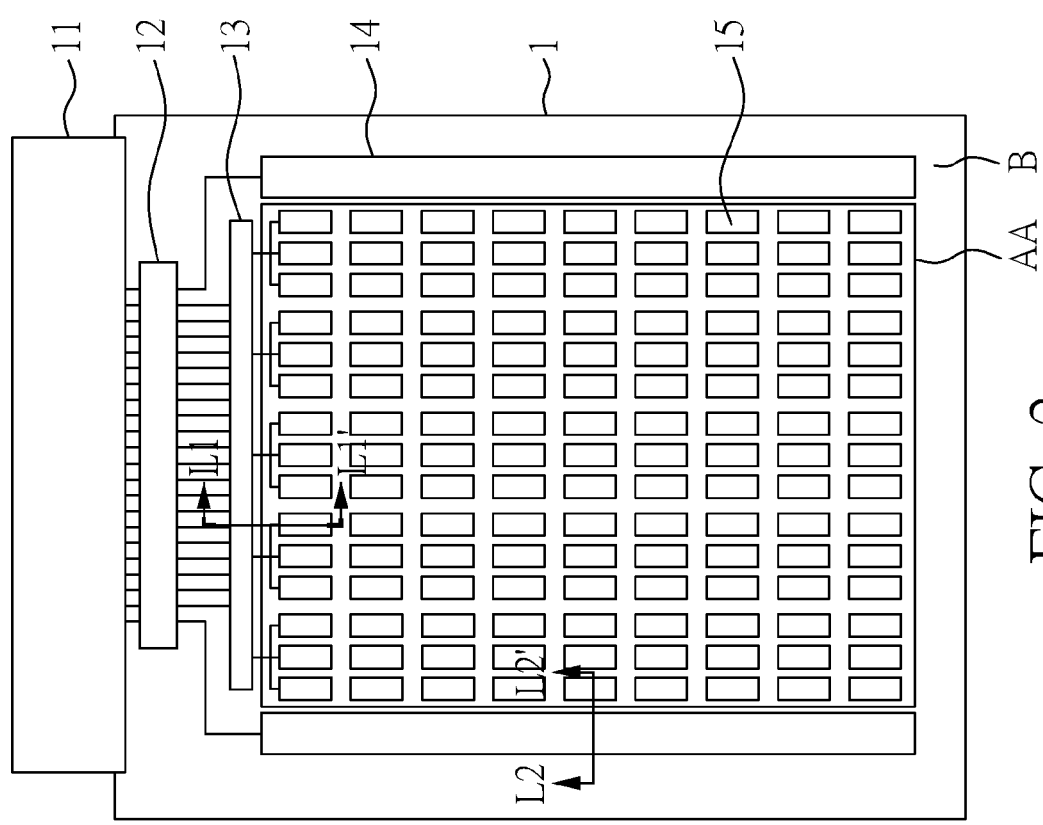
FIG. 2 is a top view of a display device according to Embodiment 1 of the present disclosure.

FIG. 2 is a top view of a display device of the present embodiment. As shown in FIG. 1 and FIG. 2, the display device of the present embodiment comprises: a display region AA and a peripheral region B, and the peripheral region B is adjacent to the display region AA. As shown in FIG. 2, the display device of the present embodiment comprises: a print circuit board 11 partially disposed on the peripheral region B; an IC 12 disposed on the peripheral region B and electrically connecting to the print circuit board 11; a demultiplexer 13 (indicated as DeMux in FIG. 3 and FIG. 7) disposed on the peripheral region B and electrically connecting to the IC 12; a driver circuit 14 (indicated as Gate Driver in FIG. 4 and FIG. 6) disposed on the peripheral region B and electrically connecting to the IC 12; and plural pixel units 15 disposed on the display region AA, wherein the pixel units 15 receive signals from the driver circuit 14 and the demultiplexer 13.

In the display device of the present embodiment, the first substrate 1 is provided with plural pixel units 15, and at least one transistor is contained in each of the pixel units 15. In the present embodiment, one transistor including an oxide semiconductor layer is comprised in one pixel unit 15, but the present disclosure is not limited thereto. Furthermore, the driver circuit 14 and the demultiplexer 13 may also comprise plural transistors. The transistors used in the driver circuit 14 and the demultiplexer 13 can be a transistor comprising a silicon semiconductor layer (for example, low-temperature polycrystalline silicon (LTPS) thin film transistor) for the narrow border design. Hereinafter, the process for preparing the transistor including an oxide semiconductor layer disposed on the display region AA and the transistor including a silicon semiconductor layer disposed on the peripheral region B (i.e. the driver circuit 14 and the demultiplexer 13) are illustrated in brief.

Figure 3:
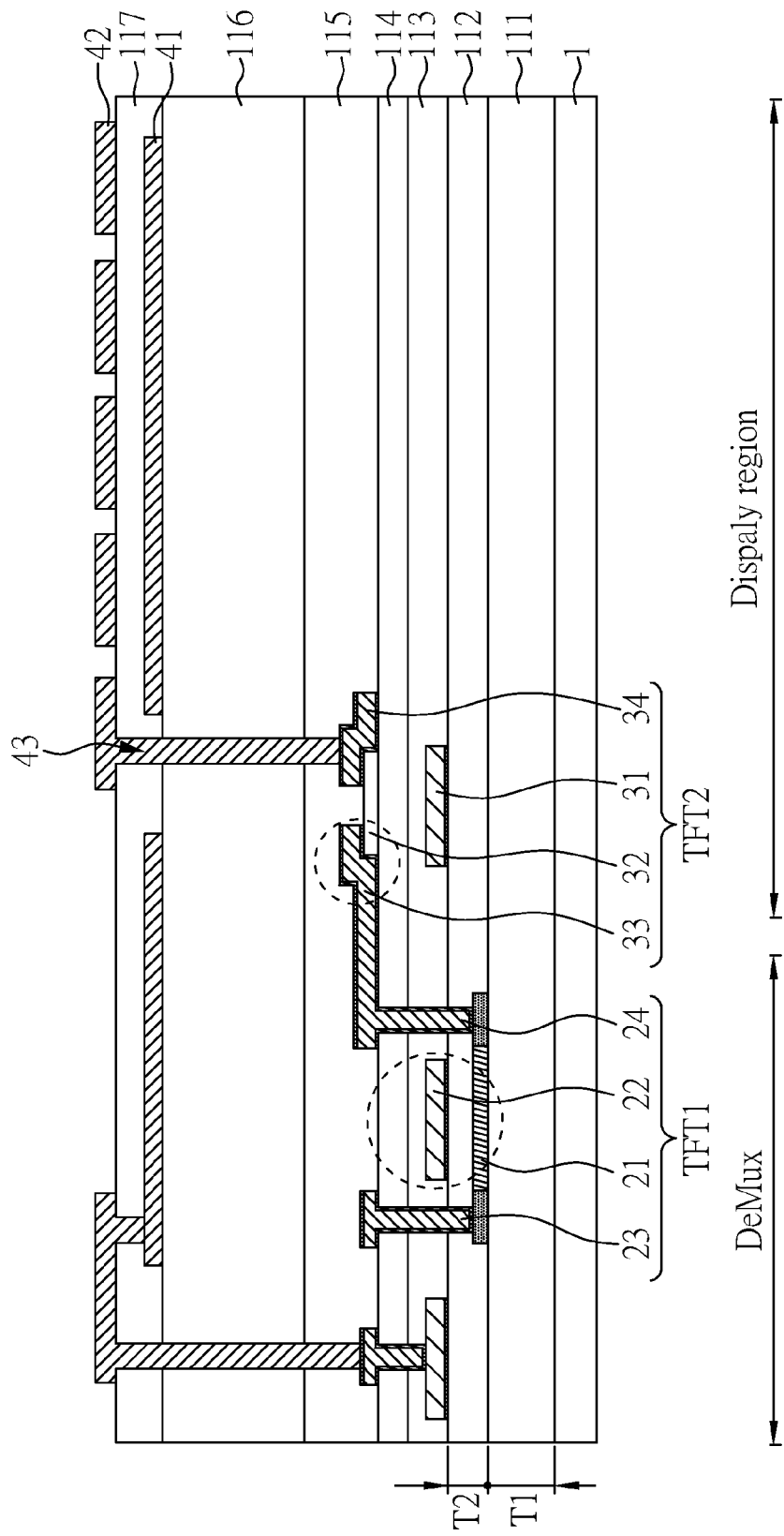
FIG. 3 is a schematic cross sectional view of a display device along a line L1-L1' shown in FIG. 2.
Figure 4:
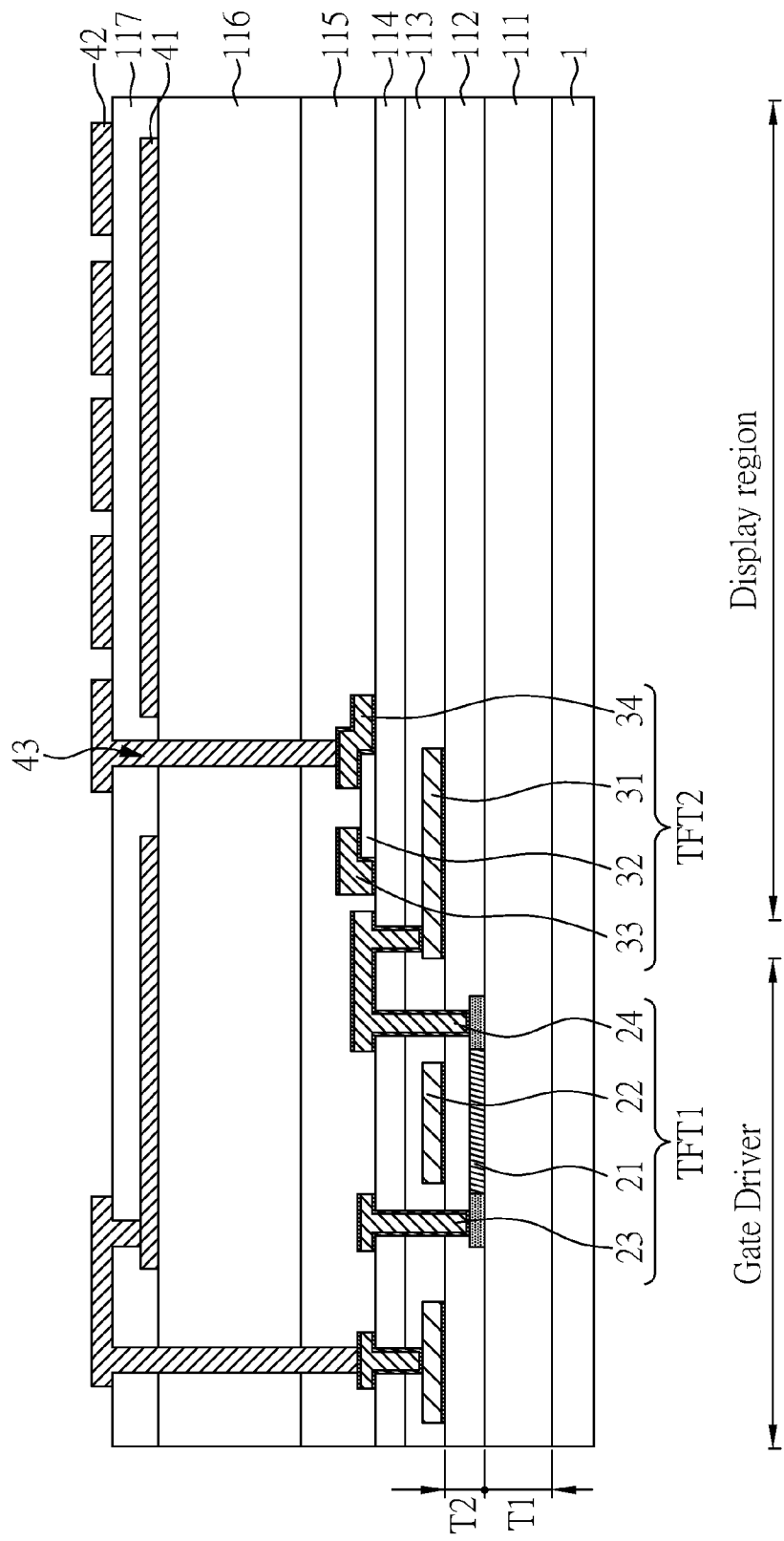
FIG. 4 is a schematic cross sectional view of a display device along a line L2-L2' shown in FIG. 2.

FIG. 3 and FIG. 4 are respectively schematic cross sectional views of the display device along line L1-L1' and L2-L2' shown in FIG. 2. First, a first substrate 1 is provided, followed by forming a first insulating layer 111 on the first substrate 1. Herein, the material of the first substrate 1 is illustrated before, and not repeated again. The first insulating layer 111 may comprise silicon oxide. In the present embodiment, the first insulating layer 111 is a silicon oxide layer.

Next, an amorphous silicon layer is formed on the first insulating layer 111, and then an annealing process is applied onto the amorphous silicon layer to obtain a first semiconductor layer 21 which is a low temperature polysilicon layer. Herein, regions of the first semiconductor layer 21 that a first source electrode 23 and a first drain electrode 24 to be formed thereon are doped. After forming the first semiconductor layer 21, a second insulating layer 112 is formed. Herein, the second insulating layer 112 may comprise silicon oxide. In the present embodiment, the second insulating layer 112 is a silicon oxide layer.

Then, a first gate electrode 22 and a second gate electrode 31 are formed on the second insulating layer 112, followed by sequentially forming a third insulating layer 113 and a fourth insulating layer 114. Herein, the third insulating layer 113 may comprise silicon nitride, and the fourth insulating layer 114 may comprise silicon oxide. In the present embodiment, the third insulating layer 113 is a silicon nitride layer, and the fourth insulating layer 114 is a silicon oxide layer.

A second semiconductor layer 32 being an oxide semiconductor layer is formed on the fourth insulating layer 114, and then a first source electrode 23, a first drain electrode 24, a second source electrode 33 and a second drain electrode 34 are formed on the second semiconductor layer 32 and the fourth insulating layer 114. Then, a first passivation layer 115 and an organic layer 116 are sequentially formed on the first source electrode 23, the first drain electrode 24, the second source electrode 33 and the second drain electrode 34, followed by forming a first conductive layer 41 thereon. Herein, the first passivation layer 114 may comprise silicon oxide. In the present embodiment, the first passivation layer 114 is a silicon oxide layer. In addition, the organic layer 116 may comprise any organic materials.

Then, a second passivation layer 117 is formed on the first conductive layer 41, followed by forming a second conductive layer 42, in which the second conductive layer 42 is electrically connected to the second drain electrode 34 through a contact via 43. Herein, the second passivation layer 117 may comprise silicon oxide, silicon nitride, or silicon nitroxide; but the present disclosure is not limited thereto. In addition, the first conductive layer 41 and the second conductive layer 42 can comprise a transparent conductive oxide, such as ITO, IZO, ITZO and the like.

After the aforesaid process, the display device of the present embodiment is obtained. As shown in FIG. 3 and FIG. 4, the display device of the present embodiment comprises: a first substrate 1; a first transistor TFT1 disposed on the a first substrate 1, wherein the first transistor TFT1 comprises a first semiconductor layer 21; a second transistor TFT2 disposed on the first substrate 1, wherein the second transistor TFT2 comprises a second semiconductor layer 32; and a first insulating layer 111 disposed under the first semiconductor layer 21.

Herein, the first semiconductor layer 21 is a silicon semiconductor layer, and the second semiconductor layer 32 is an oxide semiconductor layer. The silicon semiconductor layer can be a low temperature polysilicon layer. The oxide semiconductor layer can be an IGZO layer, an ITZO layer or an IGTZO layer. In the present embodiment, the oxide semiconductor layer is the IGZO layer. Therefore, the first transistor TFT1 is an LTPS transistor, and the second transistor TFT2 is an IGZO transistor. However, the present disclosure is not limited thereto, as long as one of the first semiconductor layer and the second semiconductor layer comprises a silicon semiconductor layer and the other comprises an oxide semiconductor layer.

In addition, as shown in FIG. 2 to FIG. 4, the display device of the present embodiment comprises a display region AA and a peripheral region B, wherein the peripheral region B is adjacent to the display region AA. The first transistor TFT1 is disposed on the peripheral region peripheral region B (i.e. the driver circuit 14 and the demultiplexer 13), and the second transistor TFT2 is disposed on the display region AA.

As shown in FIG. 3 and FIG. 4, the first insulating layer 111 can comprise silicon oxide. In the present embodiment, the first insulating layer 111 is a silicon oxide layer. In addition, a thickness T1 of the first insulating layer 111 can be greater than or equal to 200 nm and less than or equal to 500 nm. In another embodiment, the thickness T1 of the first insulating layer 111 can be greater than or equal to 250 nm and less than or equal to 400 nm. In further another embodiment, the thickness T1 of the first insulating layer 111 can be greater than or equal to 250 nm and less than or equal to 300 nm. When the thickness T1 of the first insulating layer 111 is within the aforesaid range, the first transistor TFT1 has desirable electrical performance. If the thickness T1 of the first insulating layer 111 is less than 200 nm (even less than 250 nm), the negative-bias-temperature-stress (NBTS) stability of the first transistor TFT1 with the silicon semiconductor layer is reduced. Therefore, in the display device of the present embodiment, the specific thickness range of the first insulating layer 111 is one factor relating to the performance of the first transistor TFT with the silicon semiconductor layer.

As shown in FIG. 3 and FIG. 4, the display device of the present embodiment further comprise a second insulating layer 112 on the first semiconductor layer 21, and the second insulating layer 112 comprises silicon oxide and contacts the first semiconductor layer 21. In the present embodiment, the second insulating layer 112 is a silicon oxide layer. In addition, the thickness T1 of the first insulating layer 111 is greater than or equal to a thickness T2 of the second insulating layer 112. Herein, a thickness T2 of the second insulating layer 112 can be greater than or equal to 100 nm and less than or equal to 200 nm. In another embodiment, the thickness T2 of the second insulating layer 112 can be greater than or equal to 100 nm and less than or equal to 150 nm. If the thickness T2 of the second insulating layer 112 is within the aforesaid range, the first transistor TFT with the silicon semiconductor layer has desirable electrical charging ability and low current leakage properties.

In the present embodiment and other embodiments of the present disclosure, a ratio is the thickness T1 of the first insulating layer 111 to the thickness T2 of the second insulating layer 112, and the ratio can be greater than or equal to 1 and less than or equal to 5. In another embodiment, the ratio can be greater than or equal to 1.25 and less than or equal to 4. In further another embodiment, the ratio can be greater than or equal to 1.5 and less than or equal to 3.

In the present embodiment and other embodiments of the present disclosure, the term "thickness" refers to a maximum thickness of the indicated layer.

As shown in FIG. 3 and. FIG. 4, the second semiconductor layer 32 is disposed above the first insulating layer 111. In addition, the display device of the present embodiment further comprises a third insulating layer 113 and a fourth insulating layer 114, wherein the third insulating layer 113 is disposed above the first semiconductor layer 21, the fourth insulating layer 114 is disposed on the third insulating layer 113, the third insulating layer 113 comprises silicon nitride, the fourth insulating layer 114 comprises silicon oxide, and the second semiconductor layer 32 is directly disposed on the fourth insulating layer 114. Furthermore, both the first gate electrode 22 and the second gate electrode 31 are disposed between the second insulating layer 112 and the third insulating layer 113. Moreover, the first source electrode 23, the first drain electrode 24, the second source electrode 33 and the second drain electrode 34 are disposed on the fourth insulating layer 114.

In the present embodiment, the first semiconductor layer 21 being a silicon semiconductor layer is disposed on the first insulating layer 111, the second insulating layer 112 is the gate insulating layer of the first transistor TFT1, and the third insulating layer 113 and the fourth insulating layer 114 are the interlayer dielectric layer of the first transistor TFT1. On the other hand, the second semiconductor layer 32 being an oxide semiconductor layer is disposed on the fourth insulating layer 114, the third insulating layer 113 and the fourth insulating layer 114 are the gate insulting layer of the second transistor TFT2, and the first passivation layer 115 is the back passivation for the second transistor TFT2. Hence, in the present embodiment, the gate insulating layers and the interlayer dielectric layers/passivation layers of the first transistor TFT1 and the second transistor TFT2 are different; and the interlayer dielectric layer of the first transistor TFT1 (i.e. the third insulating layer 113 and the fourth insulating layer 114) are used as the gate insulating layer of the second transistor TFT2.

In addition, the first gate electrode 22 and the second gate electrode 31 are formed by the same layer, and the first source electrode 23, the first drain electrode 24, the second source electrode 33 and the second drain. electrode 34 are formed by the same layer.

Figure 5B:
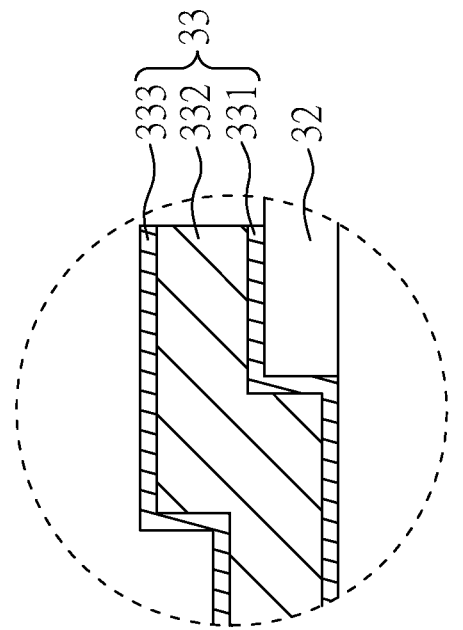
FIG. 5B is another enlarged view of FIG. 3.
Figure 5A:
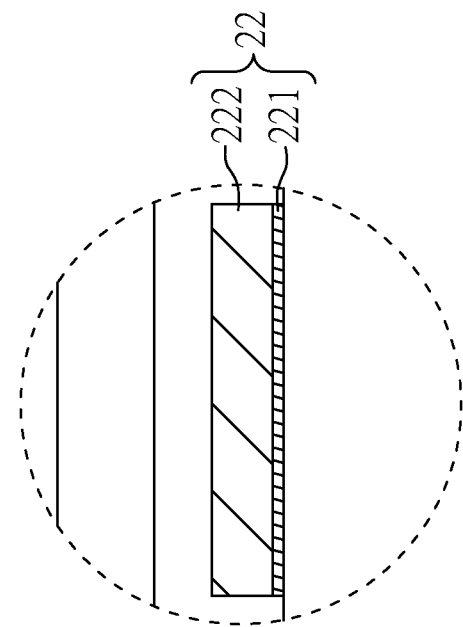
FIG. 5A is one enlarged view of FIG. 3.

FIG. 5A is one enlarged view of FIG. 3, which shows an enlarged view of the first gate electrode 22 of the first transistor TFT1. As shown in FIG. 3 and FIG. 5A, the first gate electrode 22 has a double layered structure comprising a fourth metal layer 221 and a fifth metal layer 222, and the fourth metal layer 221 is disposed between the first substrate 1 and the fifth metal layer 222. The fourth metal layer 221 is used as a barrier layer, and the material thereof may be Mo, Ti or an alloy thereof. The material of the fifth metal layer 222 may be Al, Cu or an alloy thereof. However, the present disclosure is not limited thereto. In addition, in the present embodiment, the second gate electrode 31 and the first gate electrode 22 have the same structures, and the structure of the second gate electrode 31 is not repeated again.

FIG. 5B is another enlarged view of FIG. 3, which shows an enlarged view of the second source electrode 33 of the second transistor TFT2. Herein, the second source electrode 33 has a triple layered structure comprising a first metal layer 331, a second metal layer 332 and a third metal layer 333, the first metal layer 331 contacts the second semiconductor layer 32, and the second metal layer 332 is disposed between the first metal layer 331 and the third metal layer 333. The first metal layer 31 is used as a barrier layer, and the material thereof may be Mo, Ti or an alloy thereof The material of the second metal layer 332 may be Al, Cu or an alloy thereof. The third metal layer 333 is used as a capping layer, and the material thereof may be Mo, Ti or an alloy thereof. However, the present disclosure is not limited thereto. In addition, in the present embodiment, the first source electrode 23, the first drain electrode 24, the second source electrode 33 and the second drain electrode 34 have the same structures, and the structures of other electrodes are not repeated again.

As illustrated above, the second source electrode 33 and the second drain electrode 34 have a triple layered structure, in which the first metal layer 331 is used as a barrier layer. The material of the second metal layer 332 can be Al, Cu or an alloy thereof, which may combine with the oxygen atoms in the oxide semiconductor layer (i.e. the second semiconductor layer 32). Hence, when the second source electrode 33 and the second drain electrode 34 comprise the first metal layer 31 as a barrier layer, the aforesaid shortage can be overcome.

Embodiment 2

Figure 6:
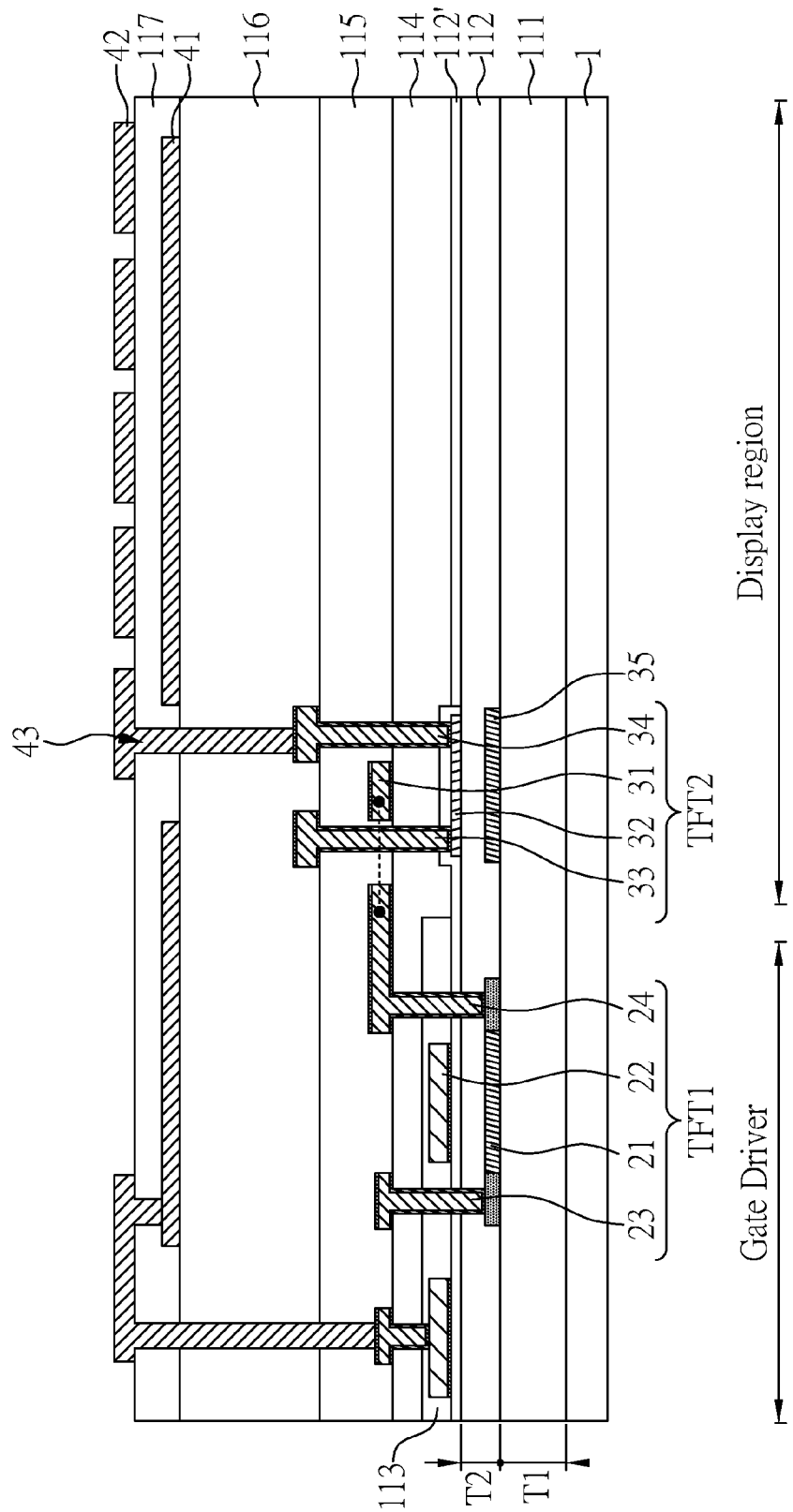
FIG. 6 is a schematic cross section view of a display device according to Embodiment 2 of the present disclosure along a line L2-L2' shown in FIG. 2.

The structure of the display device of the present embodiment is similar to that of Embodiment 1, and FIG. 6 is a schematic cross section view of the display device of the present embodiment along a line L2-L2' shown in FIG. 2.

In the present embodiment, the second insulating layer 112 comprises silicon oxide and contacts the first semiconductor layer 21, and the second semiconductor layer 32 is disposed on the second insulating layer 112. In addition, a fifth insulating layer 112' is further formed on the second semiconductor layer 32 and the second insulating layer 112, and the fifth insulating layer 112' may also comprise silicon oxide. In the present embodiment, the second insulating layer 112 is an silicon oxide layer and the fifth insulating layer 112' is another silicon oxide layer, wherein the hydrogen atom percentage in the silicon oxide layer of the second insulating layer 112 may be within 5% and 10%, and the hydrogen atom percentage in the silicon oxide layer of the fifth insulating layer 112' may be below 3%.

In the present embodiment, the third insulating layer 113 is only formed on the peripheral region B, and not on the active region AA. In addition, the second transistor TFT2 has a top gate structure, and the second gate electrode 31, the first source electrode 23 and the first drain electrode 24 are formed by the same layer. Herein, the dashed line between the first drain electrode 24 and the second gate electrode 31 means that the first drain electrode 24 and the second gate electrode 31 are electrically connected in other cross section view of the display device of the present embodiment.

Furthermore, the display device of the present embodiment further comprises a light shielding layer 35 disposed below the second semiconductor layer 32. Herein, the light shielding layer 35 and the first semiconductor layer 21 are formed by the same layer; and therefore, the light shielding layer 35 comprises silicon semiconductor layer.

Embodiment 3

Figure 7:
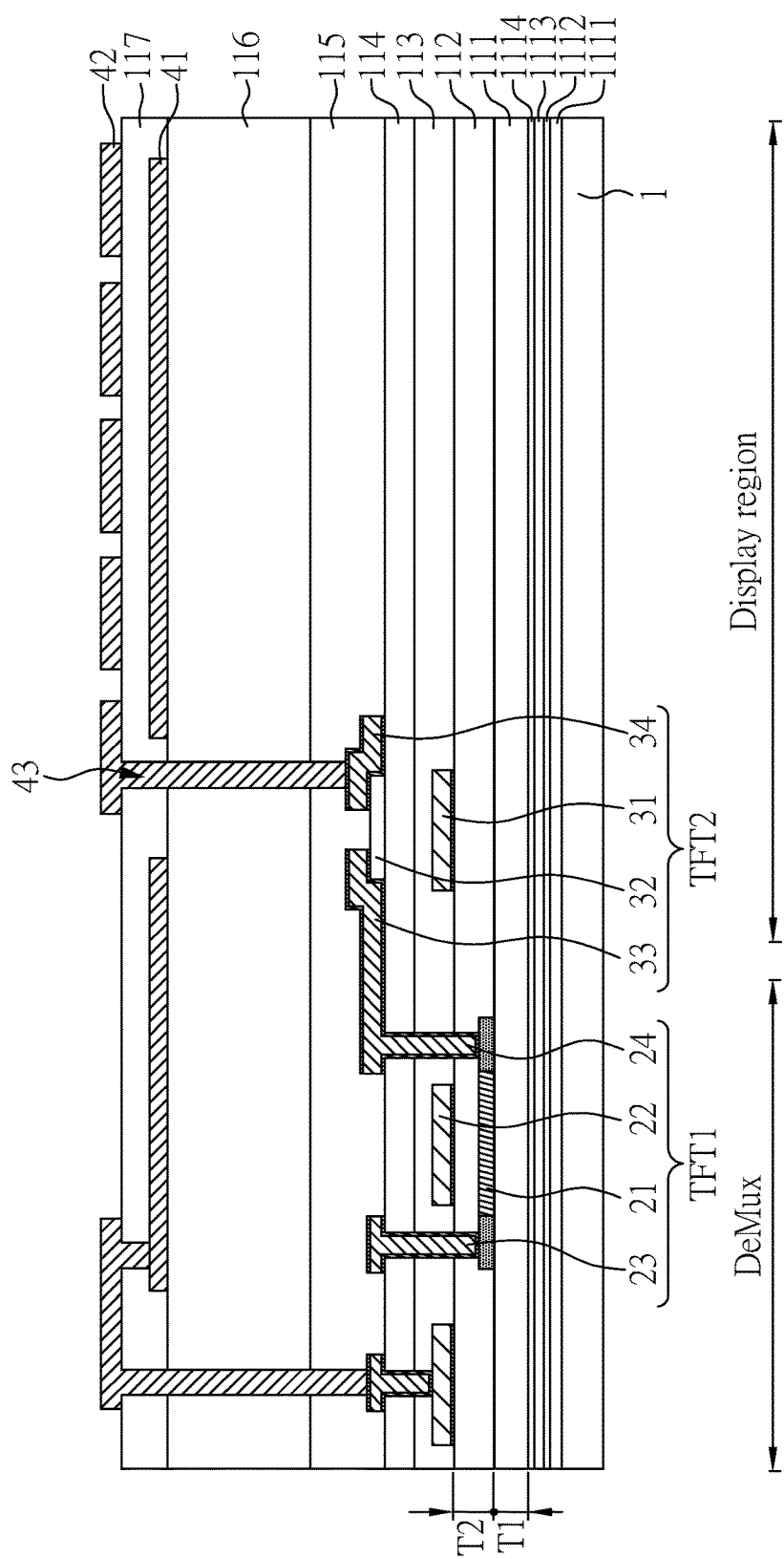
FIG. 7 is a schematic cross section view of a display device according to Embodiment 3 of the present disclosure along a line L1-L1' shown in FIG. 2.

The structure of the display device of the present embodiment is similar to that of Embodiment 1, and FIG. 7 is a schematic cross section view of the display device of the present embodiment along a line L1-L1' shown in FIG. 2.

In the present embodiment, the display device further comprises: a first buffer layer 1111 disposed on the first substrate 1; a second buffer layer 1112 disposed on the first buffer layer 1111; a third buffer layer 1113 disposed on the second buffer layer 1112; and a fourth buffer layer 1114 disposed on the third buffer layer 1113 and below the first insulating layer 111. Herein, the first buffer layer 1111, the third buffer layer 1113 and the first insulating layer 111 respectively comprise silicon oxide; and in the present embodiment, the first buffer layer 1111, the third buffer layer 1113 and the first insulating layer 111 are respectively a silicon oxide layer. In addition, the second buffer layer 1112 and the fourth buffer layer 1114 respectively comprises silicon nitride; and in the present embodiment, the second buffer layer 1112 and the fourth buffer layer 1114 are respectively a silicon nitride layer. In addition, the fourth buffer layer 1114 directly contacts the first insluting layer 111.

In the present embodiment and the forging embodiment, the first insulating layer 111 is formed on the first substrate 1 before forming the first semiconductor layer 21, to prevent moisture or water molecules from degrading the semiconductor performances. In order to further prevent moisture or water molecules from degrading the semiconductor performances, in the present embodiment, the first buffer layer 1111, the second buffer layer 1112, the third buffer layer 1113 and the fourth buffer layer 1114 are sequentially formed on the first substrate 1 in advance, and then the first insulating layer 11.1 is formed on the fourth buffer layer 1114.

Silicon nitride ($Si_3N_4$ or $SiN_x$) film has better moisture and water resistance property than silicon oxide ($SiO_2$) film. Which is, when films are deposited using the same method at the same temperature and thickness, the water vapor transmission rate (WVTR) of the $Si_3N_4$ and $SiN_x$ films are lower than the WVTR of $Si_2N_2O$ and $SiO_2$ films. Hence, in the present embodiment, the first buffer layer 1111, the second buffer layer 1112, the third buffer layer 1113, the fourth buffer layer 1114 and the first insulating layer 111 are alternating silicon oxide-silicon nitride layers, which can be formed by plasma enhanced chemical vapor deposited (PECVD) method. This multi-layered structure of alternating silicon nitride and silicon oxide layers can provide vertically continuous different levels of energy barrier to the layers, enhancing the moisture or water resistance; and this advantage is more significant when the first substrate 1 is a plastic substrate.

As shown in FIG. 7, in the multi-layered structure of alternating silicon nitride and silicon oxide layer of the present embodiment, the topmost layer is the first insulating layer 111 which is a silicon oxide layer, and the silicon oxide layer as the first insulating layer 111 can avoid any alteration to the performance of the first semiconductor layer 21.

Moreover, in the present embodiment, the first buffer layer 1111 directly contacts the first substrate 1, and the first buffer layer 1111 is a silicon oxide layer to provide better adhesion with the first substrate 1.

Test Example

FIG. 8 is a schematic cross section view of a LTPS transistor used in the present test example. As shown in FIG. 8, the transistor used in the present test example comprises: a first substrate 1; a light shielding layer 25 on the first substrate; a first buffer layer 1111 on the light shielding layer 25, wherein the first buffer layer 1111 is a silicon oxide layer; a second buffer layer 1112 on the first buffer layer 1111, wherein the second buffer layer 1112 is a silicon nitride layer; a third buffer layer 1113 on the second buffer layer 1112, wherein the third buffer layer 1113 is a silicon oxide layer; a fourth buffer layer 1114 on the third buffer layer 1113, wherein the fourth buffer layer 1114 is a silicon nitride layer; a first insulating layer 111 disposed on the fourth buffer layer 1114, wherein the first insulating layer 111 is a silicon oxide layer; a first semiconductor layer 21 on the first insulating layer 111; a second insulating layer 112 on the first semiconductor layer 21; a first gate electrode 22 on the second insulating layer 112; a third insulating layer 113 on the first gate electrode 22; a first source electrode 23 and a first drain electrode 24 disposed on the third insulating layer 113 and electrically connected to the first semiconductor layer 21; a first passivation layer 115 on the first source electrode 23 and the first drain electrode 24; and a planer layer 116 disposed on the first passivation layer 115.

In the present test example, the I-V curves of the LTPS transistors comprising the first insulating layers 111 with various thicknesses (i.e. 1000 Å, 1500 Å, 2000 Å, and 2500 Å) are examined after 1 hour operation; and the results are shown in FIG. 9.

As shown in FIG. 9, the LTPS transistors comprising the first insulating layers 111 with various thicknesses have similar initial I-V curves. However, if the thickness of the first insulating layer 111 is less than 200 nm (even less than 250 nm), the negative-bias-temperature-stress (NBTS) stability of the LTPS transistor is reduced. Therefore, the thinner the thickness of the first insulating layer 111 (the silicon oxide layer), the worse the NBTS stability.

It should be noted that as the thickness of the first insulating layer 111 increases, the surface roughness of the first insulating layer 111 increases. When the thickness of the first insulating layer 111 is near ~300 nm, the surface roughness is too rough, so that the mobility of the LTPS transistors decreases significantly, resulting in the LTPS transistors with lower ON current.

Figure 10:
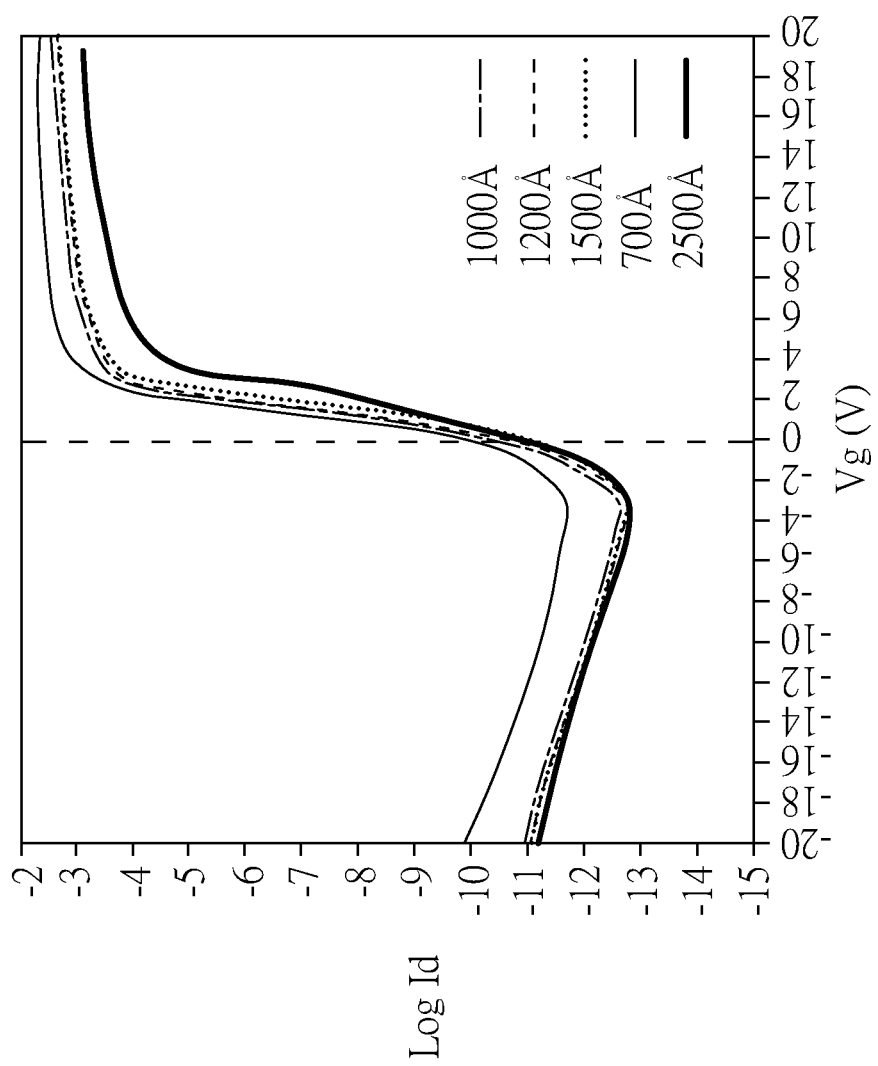
FIG. 10 is a simulation result showing I-V curves of LTPS transistors with second insulating layers with different thicknesses.

In the present test example, the I-V curves of the LTPS transistors comprising the second insulating layers 112 with various thicknesses (i.e. 700 Å, 1000 Å, 1200 Å, 1500 Å, and 2500 Å) are examined; and the results are shown in FIG. 10 and the following Table 1.

TABLE 1

| Second insulating layer thickness | $I_{ON}$ (@ Vg = 18 V) | $I_{OFF}$ (@ Vg = −4 V) |
|---|---|---|
| 700 Å | 6.63E−05 | 2.95E−13 |
| 1000 Å | 3.90E−05 | 3.88E−14 |
| 1200 Å | 2.74E−05 | 2.53E−14 |
| 1500 Å | 2.53E−05 | 2.84E−14 |
| 2500 Å | 8.42E−06 | 2.11E−14 |

As shown in FIG. 10 and Table 1, as the thickness of the second insulating layer 112 is decreased, $I_{OFF}$ is increased; and this indicates that current leakage may be occurred in the LTPS transistor. As the thickness of the second insulating layer 112 is increased, $I_{ON}$ is reduced and sub-threshold swing is increased; and this indicates that the charging ability of the LTPS transistor is decreased. Therefore, in order to make the LTPS transistor have optimum electrical charging ability and low current leakage properties, the thickness of the second insulating layer 112 should be within 1000 Å and 1500 Å because stable $I_{ON}$ and $I_{OFF}$ performance can be achieved.

Other Embodiments

A display device made as described in any of the embodiments of the present disclosure as described previously may be integrated with a touch panel to form a touch display device. Moreover, a display device or touch display device made as described in any of the embodiments of the present disclosure as described previously may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising:
a first substrate comprising a display region and a peripheral region, wherein the peripheral region is adjacent to the display region;
a first transistor disposed on the peripheral region, wherein the first transistor comprises a first semiconductor layer;
a second transistor disposed on the display region, wherein the second transistor comprises a second semiconductor layer;
a first insulating layer disposed under the first semiconductor layer;
wherein a thickness of the first insulating layer is greater than or equal to 200 nm and less than or equal to 500 nm;
wherein the first semiconductor layer is a silicon semiconductor layer, and the second semiconductor layer is an oxide semiconductor layer
a first buffer layer disposed on the first substrate, a second buffer layer disposed on the first buffer layer, a third buffer layer disposed on the second buffer layer, and a fourth buffer layer disposed on the third buffer layer and below the first insulating layer; wherein the first buffer layer, the third buffer layer and the first insulating layer respectively comprise comprises silicon oxide, and the second buffer layer and the fourth buffer layer respectively comprises silicon nitride.

2. The display device of claim 1, wherein the thickness of the first insulating layer is greater than or equal to 250 nm and less than or equal to 400 nm.

3. The display device of claim 1, further comprising a second insulating layer on the first semiconductor layer, wherein the second insulating layer comprises silicon oxide and contacts the first semiconductor layer.

4. The display device of claim 3, wherein the thickness of the first insulating layer is greater than or equal to a thickness of the second insulating layer.

5. The display device of claim 3, wherein a thickness of the second insulating layer is greater than or equal to 100 nm and less than or equal to 200 nm.

6. The display device of claim 3, wherein a ratio is the thickness of the first insulating layer to a thickness of the second insulating layer, and the ratio is greater than or equal to 1 and less than or equal to 5.

7. The display device of claim 6, wherein the ratio is greater than or equal to 1.25 and less than or equal to 4.

8. The display device of claim 6, wherein the ratio is greater than or equal to 1.5 and less than or equal to 3.

9. The display device of claim 1, wherein the fourth buffer layer directly contacts the first insulting layer.

10. The display device of claim 1, wherein the first substrate is a plastic substrate.

11. The display device of claim 1, wherein the first buffer layer directly contacts the first substrate.

12. The display device of claim 1, wherein the second semiconductor layer is disposed above the first insulating layer.

13. The display device of claim 1, further comprising a second insulating layer on the first semiconductor layer, wherein the second insulating layer comprises silicon oxide and contacts the first semiconductor layer, and the second semiconductor layer is disposed on the second insulating layer.

14. The display device of claim 1, further comprising a third insulating layer and a fourth insulating layer, wherein the third insulating layer is disposed above the first semiconductor layer, the fourth insulating layer is disposed on the third insulating layer, the third insulating layer comprises silicon nitride, the fourth insulating layer comprises silicon oxide, and the second semiconductor layer is directly disposed on the fourth insulating layer.

15. The display device of claim 1, further comprising a light shielding layer disposed below the second semiconductor layer, wherein the light shielding layer comprises a silicon layer.

\* \* \* \* \*